United States Patent [19]
Oashi et al.

[11] Patent Number: 5,850,090
[45] Date of Patent: Dec. 15, 1998

[54] DYNAMIC SEMICONDUCTOR MEMORY DEVICE ON SOI SUBSTRATE

[75] Inventors: Toshiyuki Oashi; Takahisa Eimori, both of Hyogo, Japan

[73] Assignee: Mitsubishi Denki Kabushiki Kaisha, Tokyo, Japan

[21] Appl. No.: 744,677

[22] Filed: Nov. 6, 1996

Related U.S. Application Data

[63] Continuation of Ser. No. 448,718, May 24, 1995, abandoned.

[51] Int. Cl.⁶ .......................... H01L 29/78; H01L 27/108
[52] U.S. Cl. ............................ 257/296; 257/71; 257/509; 365/189.09
[58] Field of Search ..................................... 257/350, 296, 257/298, 349, 66, 69, 71, 347, 509; 365/176, 189.09

[56] References Cited

U.S. PATENT DOCUMENTS

| | | | |
|---|---|---|---|
| 5,032,891 | 7/1991 | Takagi et al. | 257/350 |
| 5,495,439 | 2/1996 | Morihara | 257/350 |

OTHER PUBLICATIONS

"Ulsi Dram/Simoz with Stacked Capacitor Cells for Low-Voltage Operation", T. Eimori et al., IEDM 1993, pp. 45–38.

Primary Examiner—Tom Thomas
Assistant Examiner—David B. Hardy
Attorney, Agent, or Firm—Lowe, Price, LeBlanc & Becker

[57] ABSTRACT

In a dynamic semiconductor memory device including a thin film SOI/MOSFET having a semiconductor layer on an insulator as an active region, an "L" level potential of a memory cell transistor, which connects/disconnects a capacitor for storing data as electric charges and a bit line for reading/writing data, is set at a fixed value higher than a ground potential and lower than a power supply potential, and a substrate bias is set at the ground potential. Even if isolation is carried out by LOCOS, sub-threshold leakage current due to a parasitic MOS in the vicinity of LOCOS edge can be suppressed because the potential of a word line is lower than that of the bit line when the memory cell transistor is in a cut-off state. Therefore, a dynamic semiconductor memory device including a thin film SOI/MOSFET which is immune to disturbing refresh can be achieved.

4 Claims, 7 Drawing Sheets

DYNAMIC SEMICONDUCTOR MEMORY DEVICE ON SOI SUBSTRATE

This application is a continuation of application Ser. No. 08/448,718 filed May 24, 1995, now abandoned.

BACKGROUND OF THE INVENTION

1. Field of the Invention

The present invention relates to dynamic semiconductor memory devices on SOI (Silicon on Insulator) substrates. More particularly, the present invention relates to a circuit structure which can improve sub-threshold characteristics of a transistor forming a memory cell.

2. Description of the Background Art

As storage capacity of a memory is increased, memory cells in such a memory are reduced in size, and it has been difficult to obtain sufficient storage capacitance for storing information as electric charges in the small memory cell area. Although a three-dimensional structure of a memory cell can be used to ensure the sufficient storage capacitance, this method requires complicated process steps.

Meanwhile, a dynamic RAM (hereinafter referred to as a DRAM) formed on an SOI substrate is soft-error free. Such characteristics help relax limitation of the minimum value of the required storage capacitance, and therefore they are effective in solving the above-described problem of the storage capacitance of a DRAM memory cell.

In addition, a thin film SOI/MOSFET has a low junction capacitance due to its structure, which contributes to low power consumption of a DRAM and reduction in bit line capacitance.

Although a DRAM on an SOI substrate has these various advantages, its device structure, especially an element isolation structure, has the following problems.

Figure 6A:
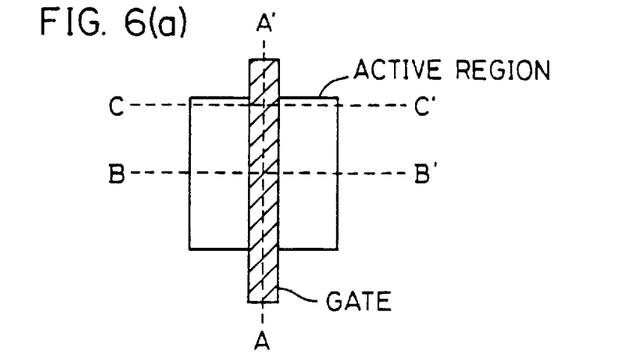
FIGS. 6(a)–6(d) are schematic cross sectional views obtained when isolation is carried out by LOCOS method in the thin film SOI/MOSFET.

In a DRAM on a bulk-Si substrate, isolation of an MOSFET forming the DRAM is generally carried out by so-called LOCOS (LOCal Oxidation of Silicon) method. FIG. 6 shows an element structure in which isolation of a thin film SOI/MOSFET is carried out by the LOCOS method. FIG. 6(a) is a plan view, (b) is a cross sectional view taken along the line A–A' in (a), (c) is a cross sectional view taken along the line B–B', and (d) is a cross sectional views taken along the line C–C'.

Figure 6B:
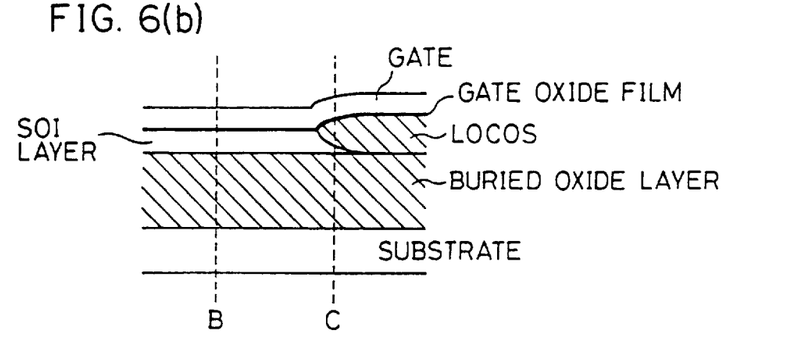
Figure 6C:
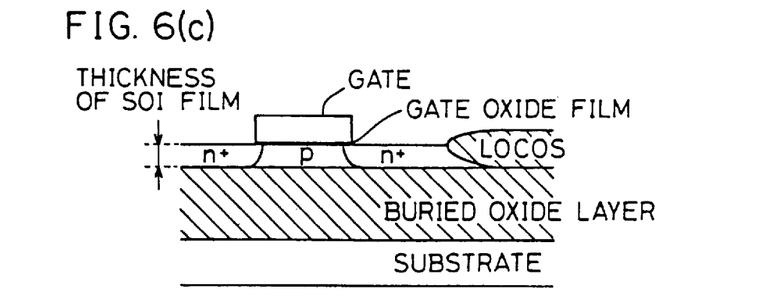
Figure 6D:
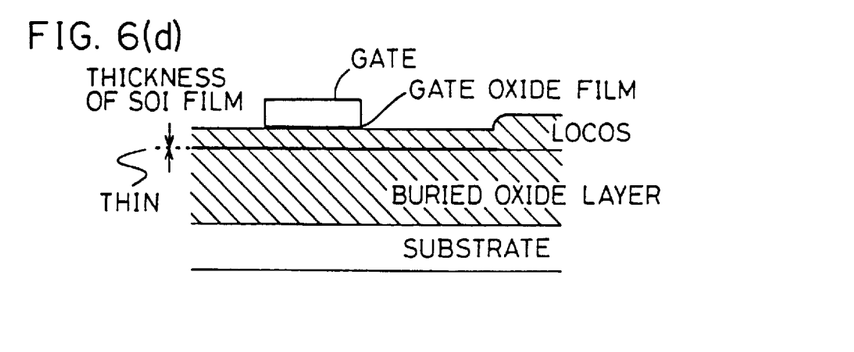

The SOI film of a channel portion in the vicinity of LOCOS edge (as shown in the cross section taken along the line C–C') of the SOI/MOSFET isolated by LOCOS is significantly thinner than that in the central portion (as shown in a cross section taken along the line B–B').

As a result, a transistor which has different characteristics from those of the intrinsic MOS transistor is generated in the vicinity of LOCOS edge. This transistor is called a parasitic MOS transistor.

Figure 7:
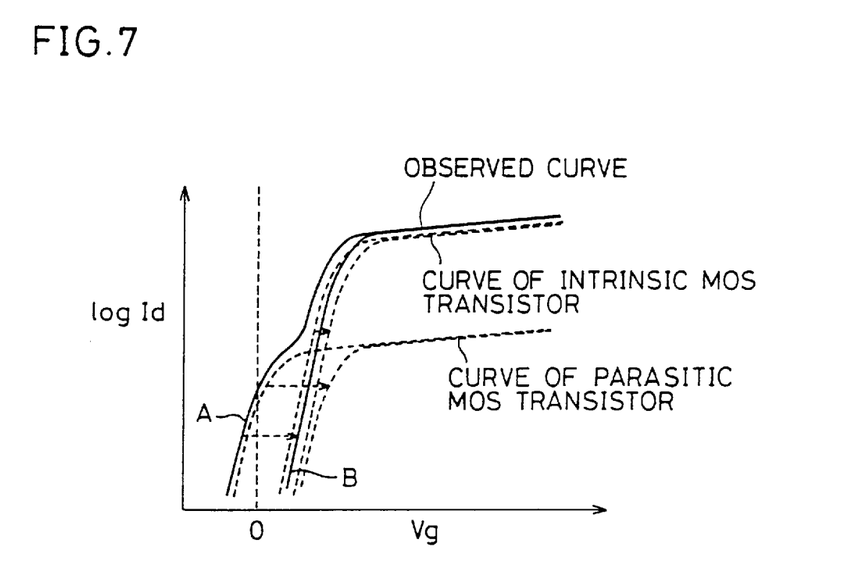
FIG. 7 shows $I_d$-$V_g$ characteristics of a thin film SOI/MOSFET in which isolation is carried out by LOCOS method.

The parasitic MOS transistor causes, for example, causes a hump current observed in the curve of Id-Vg characteristics (change in drain current Id in accordance with change in gate voltage Vg) as shown in FIG. 7, which is one characteristic of a thin film SOI/MOSFET.

This is because the observed curve of Id-Vg characteristics as a whole is a sum of a Id-Vg curve of the intrinsic transistor and that of the parasitic transistor.

More specifically, the threshold voltage of the parasitic MOS transistor is smaller than that of the intrinsic MOS transistor, and increase in drain current Id in the sub-threshold region is observed in Id-Vg characteristics (curve A of FIG. 7).

The hump current causes increase in off-current of an SOI/MOSFET. Therefore, when an SOI/MOSFET is applied to a DRAM, off-current of a transistor of a memory cell is increased, thereby deteriorating refresh characteristics. The following describes in detail what causes the deterioration of refresh characteristics.

Figure 9:
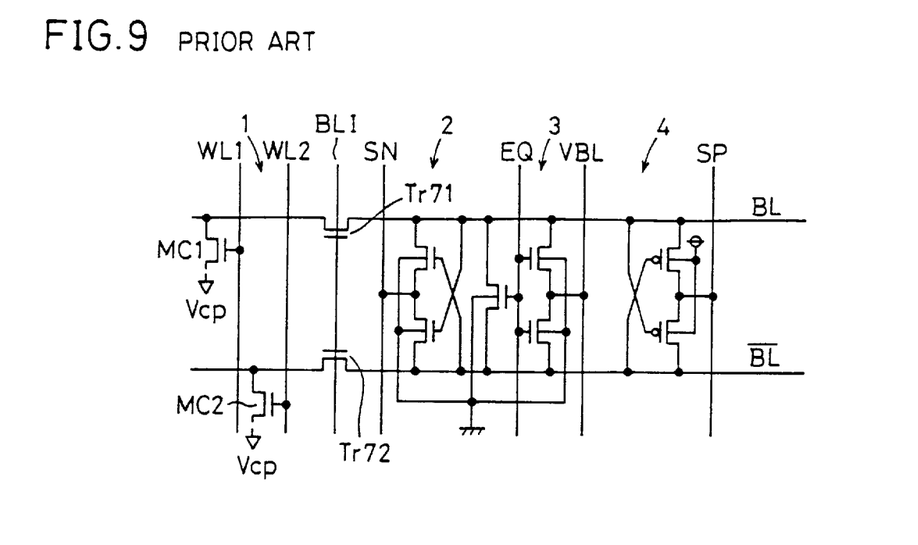
FIG. 9 is a circuit diagram showing a major portion of a conventional dynamic semiconductor memory device.
Figure 10:
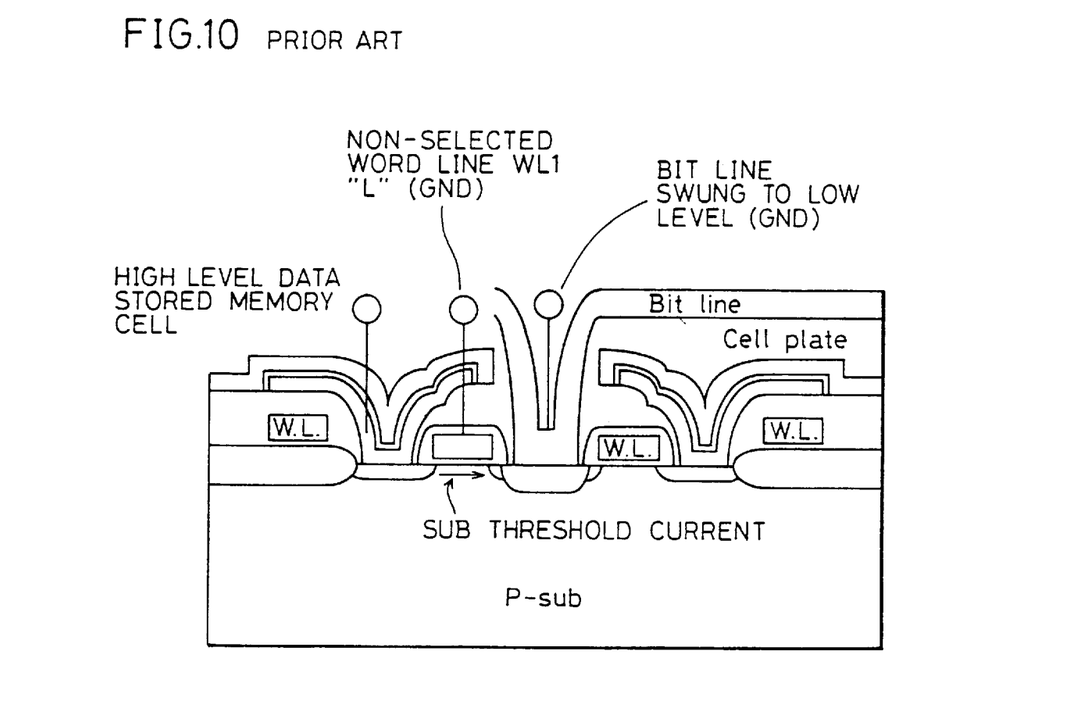
FIG. 10 shows a concept of a disturbing defect in a conventional dynamic semiconductor memory device.

FIG. 9 is a circuit diagram showing a major portion of a conventional DRAM. In FIG. 9, a memory cell MC1 is connected to a word line WL1 and to a bit line pair BL and /BL. Bit line pair BL and /BL is connected to an n channel sense amplifier 2, an equalizing circuit 3, and a p channel sense amplifier 4 through transfer gates Tr 71 and Tr72. Transfer gates Tr71 and Tr72 are controlled by a gate control signal BLI. Equalizing circuit 3 receives a VBL signal having a potential of ½ $V_{cc}$ and an EQ signal. Equalizing circuit 3 precharges bit line pair BL and /BL to the potential of ½ $V_{cc}$ by VBL signal in response to EQ signal. Sense amplifiers 2 and 4 each amplify a small difference in potential read out from memory cell MC1 to bit line pair BL and /BL. Sense amplifier 2 is activated when a sense drive line SN receives a sense activation signal SO, and sense amplifier 4 is activated when a sense drive line SP receives a sense activation signal /SO.

Figure 11:
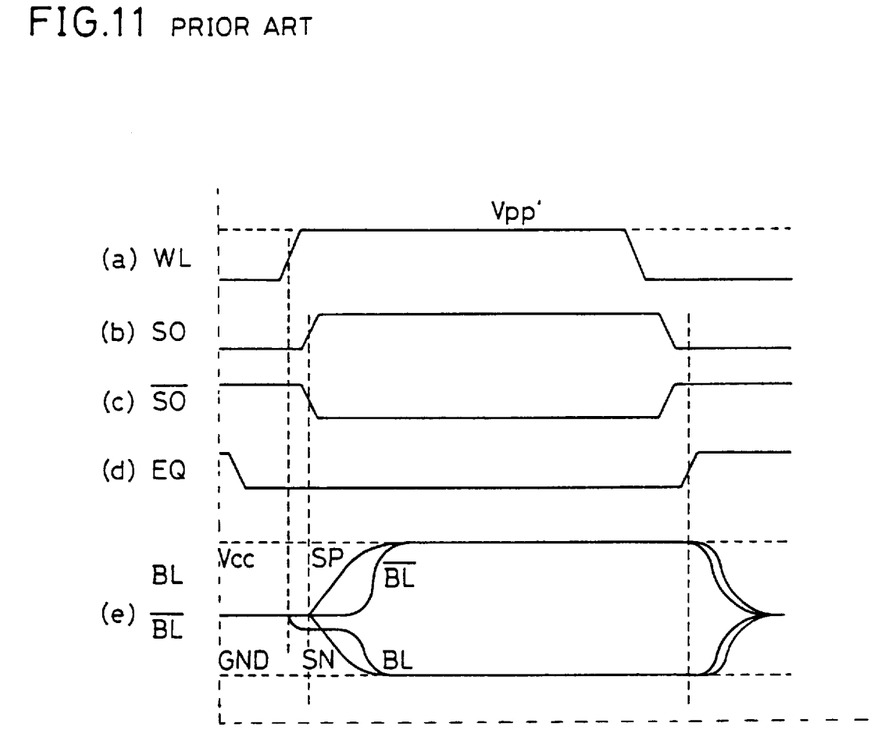
FIG. 11 is a timing chart illustrating operation of a conventional dynamic semiconductor memory device.

FIG. 11 is a timing chart illustrating operation of the memory cell array shown in FIG. 9. A plural blocks of the memory cell arrays shown in FIG. 9 are provided, and are activated when they receive respective block activation signals. Here, sense amplifiers 2 and 4, however, have not been activated yet. When data is read out from memory cell MC1, BLI signal attains an "H" (high) level, transfer gates Tr71 and Tr72 are rendered conductive, and bit line pair BL and /BL is connected to sense amplifiers 2 and 4 and equalizing circuit 3. When word line WL1 is raised to a boosted voltage level $V_{pp}'$ as shown in FIG. 11(a), the small difference in potential is read out to bit line pair BL and /BL from memory cell MC1. When activation signal SO attains an "H" level and activation signal ISO attains an "L" (low) level as shown in FIG. 11(b) and (c), sense amplifiers 2 and 4 are activated by these signals, respectively. The small difference in potential between bit line pair BL and /BL is amplified by sense amplifiers 2 and 4, and the potential is enhanced toward an "H" level or an "L" level.

A sequence of readout operation of memory cell MC1 is performed as described above. Next, let us consider an example where a similar readout operation of memory cell MC2 in FIG. 9 is performed when data at an "H" level is stored in memory cells MC1 and MC2. Since information at an "H" level is stored in memory MC2, after a potential of a word line WL2 attains an "H" level, the small difference in potential between bit line pair BL and /BL is amplified such that bit lines /BL is at an "H" level and bit line BL is at an "L" level after the readout operation.

At this time, the "L" level of bit line BL is ground potential, and the potential of word line WL1 now in non-selected state is at an "L" level, which is equal to the "L" level of bit line BL. Consequently, electric charges stored in memory cell MC1 flows out toward the bit line and thus decrease due to sub-threshold leakage current of word line WL1 having the ground potential, whereby data of memory cell MC1 may be destroyed. This is a so-called disturbing error, one of defective modes of refresh characteristics in DRAMs caused by defective sub-threshold characteristics of memory cell transistors.

Figure 8:
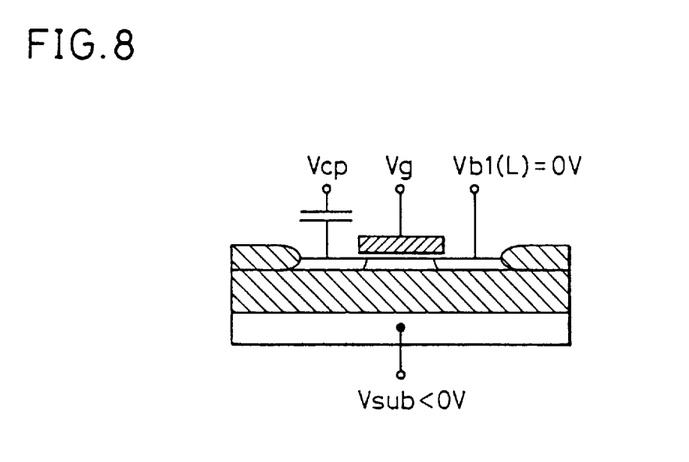
FIG. 8 schematically shows how a substrate bias is applied when a thin film SOI/n channel MOSFET is used as a memory cell transistor.

As described above, sub-threshold leakage current is increased by a parasitic MOS transistor in a thin film SOI/MOSFET. In order to improve sub-threshold characteristics by avoiding hump current generated by the parasitic MOS transistor, a negative potential can be applied to the rear surface of a wafer for an n channel MOSFET, or a positive potential for a p channel transistor. More specifically, with reference to FIG. 8, a potential $V_{b1}(L)$ of an "L" level of the bit line connected to a source electrode is set at the ground potential and a substrate potential $V_{sub}$ is set at a negative potential when the transistor is an n channel MOSFET.

In an SOI/n channel MOSFET, hump current generated by a parasitic MOS can generally be compensated by applying a negative voltage to the rear surface of a wafer (back-gate bias). When a reverse bias is applied to the back-gate in an MOSFET on a conventional bulk silicon substrate, an absolute value of the threshold voltage increases. In the case of an SOI/MOSFET, a thick oxide layer exists between the substrate and an SOI layer under the channel, so that little potential is applied to the well and the threshold voltage increases only slightly. However, the threshold voltage of the parasitic MOS having a very thin SOI layer is changed by the back-gate bias more considerably than that of the intrinsic transistor. Accordingly, referring to FIG. 7, the Id-Vg curve of the SOI/MOSFET in which isolation is carried out by LOCOS method changes from curve A obtained when the substrate bias is the ground potential to curve B obtained when the reverse bias is applied to the rear surface. In other words, hump current due to the parasitic MOSFET is suppressed.

However, the above method can be applied only to a circuit formed solely by an n channel MOSFET or a p channel MOSFET and only during on-wafer operation because the reverse bias is applied to the entire wafer. In other words, this method cannot be applied to a CMOS circuit conventionally used in a DRAM circuit.

Hump current can be suppressed also by adopting field shield isolation rather than LOCOS isolation to isolate transistors as described in 1993 *IEDM Tech. Dig.*, pp. 45–47. This method, however, requires complicated process steps. Therefore, it is desirable to carry out isolation of a thin film SOI/MOSFET by LOCOS method which is compatible with conventional processes.

SUMMARY OF THE INVENTION

One object of the present invention is to provide a dynamic semiconductor memory device including a thin film SOI/MOSFET which has a good cut-off characteristics and can be formed by simple steps.

Another object of the present invention is to provide a dynamic semiconductor memory device which allows reduction of sub-threshold leakage current of a thin film SOI/DRAM memory cell transistor employing LOCOS isolation and which has improved refresh characteristics.

A further object of the present invention is to provide a dynamic semiconductor memory device which is operable under equivalent condition where back-gate bias is effectively applied only to a memory cell transistor.

Briefly speaking, the present invention is a dynamic semiconductor memory device including semiconductor elements each having a semiconductor layer on an insulator as an active region, which includes a memory cell array, a sense amplifier, a read write control circuit, and a circuit for setting a potential. The memory cell array has a plurality of memory cells, each connected to one of a plurality of bit lines and to one of a plurality of word lines. The sense amplifier amplifies a potential change in accordance with stored data which is read out to the bit line corresponding to one memory cell of the memory cell array. The read/write control circuit controls readout of data from the memory cell array and writing of data to the memory cell array. The circuit for setting a potential sets a potential of a line which provides a low level potential to each of the bit line, the memory cell and the sense amplifier, to a potential higher than a ground potential.

In accordance with another aspect of the present invention, each memory cell forming the memory cell array includes a capacitor and an n channel MOSFET. The capacitor stores data as electric charges. The n channel MOSFET has a gate connected to the word line and electrically connects/disconnects the capacitor and the bit line. The potential set by the potential setting circuit is lower than a supply potential and higher than a potential of the word line when the n channel MOSFET is in a cut-off state.

In accordance with yet another aspect of the present invention, the present invention is a dynamic semiconductor memory device including semiconductor elements having a semiconductor layer on an insulator as an active region, which includes an internal power supply circuit, a memory cell array, a sense amplifier, a read/write control circuit, and a circuit for setting a potential. The internal power supply circuit generates an internal power supply potential based on an external power supply potential. The memory cell array has a plurality of memory cells, each connected to one of a plurality of bit lines and to one of a plurality of word lines. The sense amplifier amplifies a potential change in accordance with stored data which is read out to the bit line corresponding to one memory cell of the memory cell array. The read/write control circuit controls readout of data from the memory cell array and writing of data to the memory cell array. The circuit for setting a potential sets a potential of a line which provides a high level potential to each of the bit line, the memory cell and the sense amplifier, to a potential lower than the internal power supply potential.

In a further aspect of the present invention, each memory cell forming the memory cell array includes a capacitor and a p channel MOSFET. The capacitor stores data as electric charges. The p channel MOSFET has a gate connected to the word line and electrically connects/disconnects the capacitor and the bit line. The potential set by the potential setting circuit is higher than a ground potential and lower than a potential of the word line when the p channel MOSFET is in a cut-off state.

In accordance with a further aspect of the present invention, isolation of the semiconductor element having the semiconductor layer on the insulator as the active region is carried out by LOCOS method.

Therefore, a main advantage of the present invention is that, when the memory cell transistor in the dynamic semiconductor memory device having a semiconductor layer on an insulator as an active region is in a cut-off state, a potential lower than the low level potential of the bit line is applied to the word line. As a result, sub-threshold leakage current of the memory cell transistor can be suppressed.

Another advantage of the present invention is that influence of a parasitic MOS can be suppressed and good refresh characteristics can be achieved even if isolation of an element, forming the dynamic semiconductor memory device which has a semiconductor layer on an insulator as an active region, is carried out by LOCOS method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
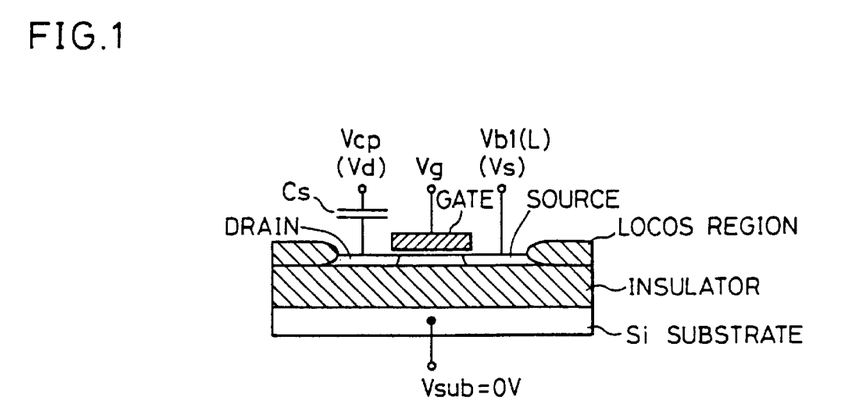
FIG. 1 schematically shows how a bias is applied when a thin film SOI/MOSFET in accordance with an embodiment of the present invention is used as a memory cell transistor.

FIG. 1 schematically shows a structure of a memory cell including a thin film SOI/n channel MOSFET in accordance with an embodiment of the present invention.

A structure of thin film Si/insulator ($SiO_2$)/Si substrate is formed by, for example, implanting ions of oxygen to the Si substrate and reacting Si with oxygen through annealing, though other methods can also be used. Thereafter, the n channel MOSFET in which isolation is carried by LOCOS method is formed similarly to conventional steps of manufacturing an MOS transistor. The n channel MOSFET has a drain connected to one end of a memory cell capacitor $C_s$. A potential of the other end of memory cell capacitor $C_s$ is generally fixed to a cell plate potential $V_{cp}$. Cell plate potential $V_{cp}$ is normally set at ½ $V_{cc}$ when a supply potential is $V_{cc}$.

The n channel MOSFET has a gate connected to a word line. This transistor is turned on/off when a gate potential $V_g$ is changed by the word line. The n channel MOSFET has a source connected to a bit line. A potential corresponding to an "L" level of the bit line is set at a potential $V_{bsg}$ supplied by a pseudo-GND level generator which will be described later. Therefore, when the memory cell is in a non-selected state and the bit line is at the "L" level, gate potential $V_g$ which is the potential of the word line is equal to a ground potential and the potential of the bit line is equal to a pseudo ground level $V_{bsg}$.

A substrate bias $V_{sub}$ is fixed to 0 V.

Figure 2:
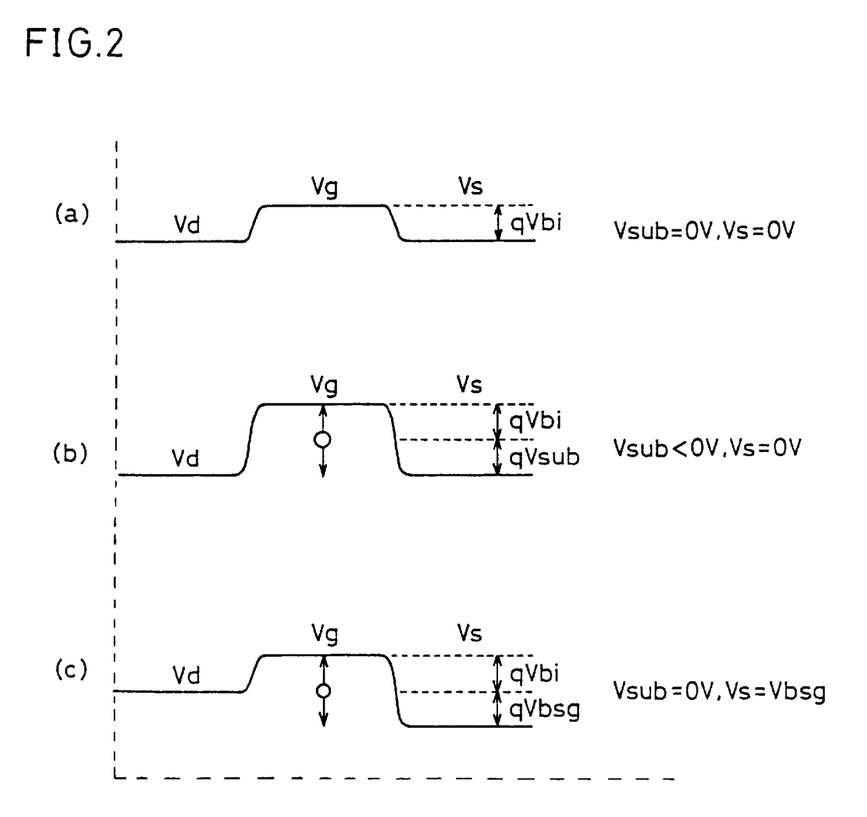
FIG. 2 is a schematic diagram showing a surface potential when a bias as is applied to an MOSFET.

FIG. 2 is a schematic diagram showing surface potential of the n channel MOSFET illustrating operation of the transistor under such bias conditions, in which (a) shows a surface potential of a transistor when a substrate bias ($V_{sub}$) and a source potential ($V_s$) are both 0 V, (b) shows a surface potential when $V_{sub}$<0 V and $V_s$=0 V, and (c) shows a surface potential of a transistor when the bias in FIG. 1 ($V_{sub}$=0 V, $V_s$=$V_{bsg}$) is applied. The threshold voltage of the transistor is determined mainly by the difference in surface potential between the gate and the source.

In FIG. 2(a), both substrate bias $V_{sub}$ and source bias $V_s$ are 0 V, and only the difference in potential corresponding to a built-in potential $V_{bi}$ of a gate electrode exists between the gate and the source.

In FIG. 2(b), substrate bias $V_{sub}$ (<0 V) is applied, and both differences in potential between the gate and the source and between the gate and the drain increase by $|V_{sub}|$. That is, a positive voltage in excess of $|V_{sub}|$ must be applied to the gate in order to form an inversion layer right under the gate and make the transistor conductive. In other words, the threshold voltage appears to shift to a positive value by $|V_{sub}|$.

In FIG. 2(c), since source bias $V_{bsg}$ (>0 V) is applied, the difference in potential between the gate and the source increases by $V_{bsg}$. There fore, the threshold voltage shifts to a positive value by $V_{bsg}$ in this case as well. In other words, as far as the sub-threshold characteristics of transistor is concerned, there appears the characteristics equivalent to those obtained when substrate bias $V_{sub}$=−$|V_{bsg}|$ is applied.

Figure 3:
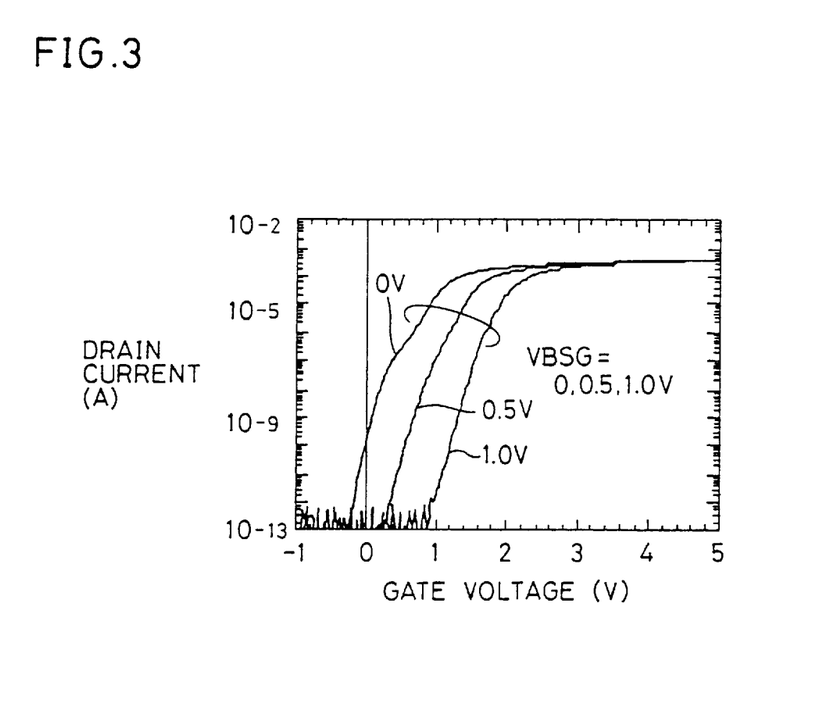
FIG. 3 shows a change in drain current-gate voltage characteristics ($I_d$-$V_g$ characteristics) due to the value of a source potential.

FIG. 3 shows a change in $I_d$-$V_g$ characteristics when the value of $V_{bsg}$ is changed.

As $V_{bsg}$ is increased from 0 V to 0.5 V and to 1.0 V, the threshold voltage shifts to a positive value and hump current components decrease. Therefore, the sub-threshold characteristics of the thin film SOI/MOS memory cell transistor in which isolation is carried out by LOCOS method are significantly improved by applying $V_{bsg}$ to the source, i.e. the bit line, as a bias voltage of "L" level.

In the above example, leakage current between the source and the drain is $10^{-11}$ A/μm per unit gate width when $V_{bsg}$=0 V, while this current is significantly reduced to $10^{-15}$ A/μm when $V_{bsg}$ is 0.5 V or more.

Figure 4:
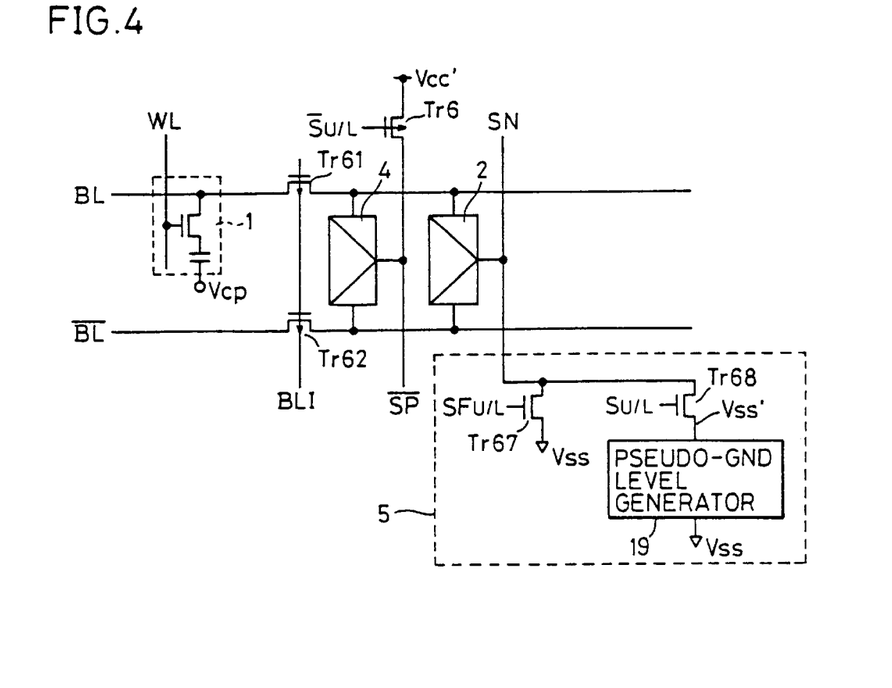
FIG. 4 is a schematic block diagram showing a circuit structure of a dynamic semiconductor memory device in accordance with one embodiment of the present invention.

FIG. 4 is a circuit diagram showing an embodiment of the present invention, when applied to a circuit disclosed in U.S. Pat. No. 08/312,968. In the figure, like reference numerals denote like components in the conventional example shown in FIG. 9, such as sense amplifiers 2 and 4. The circuit in the embodiment shown in FIG. 4 includes a ground potential setting circuit 5 for providing a low level potential to memory cell 1, bit line pair BL and /BL and sense amplifiers 2 and 4. In ground potential setting circuit 5, a potential of sense drive line SN is switched between ground potential $V_{ss}$ and pseudo-GND potential $V_{ss}$' by transistors Tr67 and Tr68. Transistor Tr67 becomes conductive by a control signal SFU/L, and transistor Tr68 is controlled by a control signal SU/L. Transistor Tr67 has a source connected to ground potential $V_{ss}$ and transistor Tr68 has a source connected to a pseudo-GND level generator 19.

Figure 5:
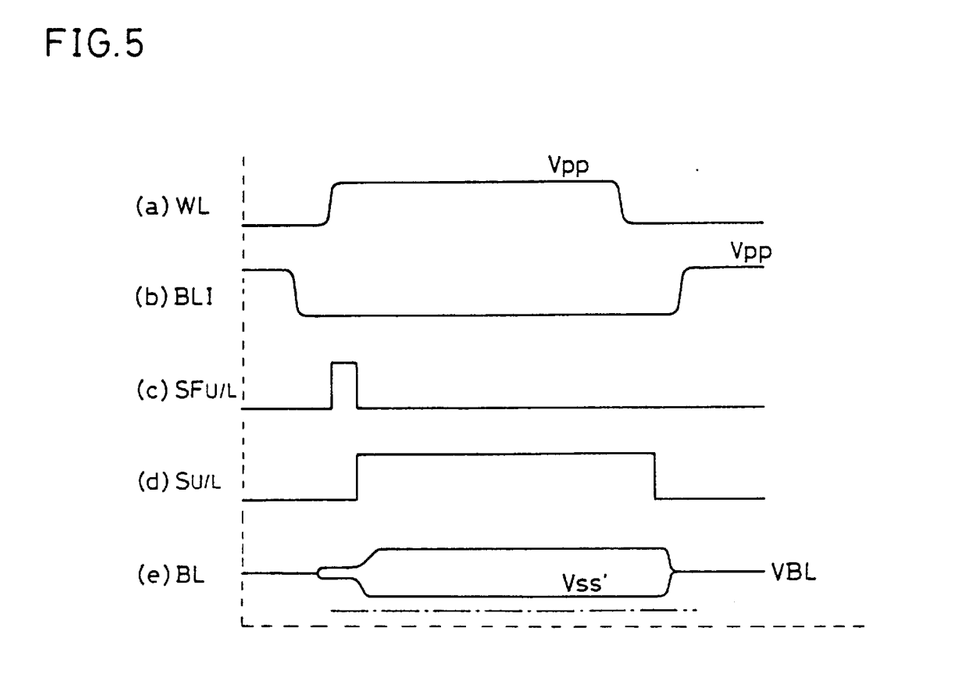
FIG. 5 is a timing chart illustrating operation of the embodiment of the present invention.

FIG. 5 is a timing chart illustrating operation of FIG. 4. As shown in FIG. 5(c), SFU/L attains an "H" level during initial sensing operation, transistor Tr67 is rendered conductive, and sense drive line SN attains ground potential $V_{ss}$. As a result, sense amplifier 2 operates between ground potential $V_{ss}$ and an internal supply voltage $V_{cc}$ ', thereby improving sensitivity during initial sensing operation and enhancing the sensing speed.

Before a potential of bit line BL at an "L" level attains pseudo-GND level $V_{ss}$' as shown in FIG. 5(e), SFU/L signal attains an "L" level and control signal SU/L attains an "H" level as shown in FIG. 5(d). Consequently, transistor Tr68 is rendered conductive and pseudo-GND level $V_{ss}$' is applied to sense drive line SN, thereby preventing overswing of bit lines BL and /BL.

Although ground potential setting circuit 5 of the present embodiment has a structure for switching generation of ground potential $V_{ss}$ and pseudo-GND level $V_{ss}'$, the present invention is not limited thereto. A structure for generating only pseudo-GND level $V_{ss}'$ can also be applied.

In addition, although the memory cell transistor is formed as an n channel MOSFET in the present embodiment, it can be also formed as a p channel MOSFET.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device, comprising:

first power supply means for supplying a ground potential;

second power supply means for supplying a predetermined potential higher than said ground potential;

a plurality of word lines the potentials of which are selectively pulled up from said ground potential to said predetermined potential;

a plurality of bit lines arranged to cross said plurality of word lines;

a memory cell array including a plurality of memory cells, each including an n-channel memory cell transistor having a source region, drain region and channel region formed in semiconductor layer on an insulator as an active region, each n-channel memory cell transistor further having a gate electrode above the channel region with an insulator layer therebetween, wherein the source region is connected to one of said bit lines and the gate electrode is connected to one of said word lines;

a sense amplifier for amplifying a potential change in accordance with stored data which is read out to said bit line corresponding to one memory cell of said memory cell array;

control means for controlling readout of data from said memory cell array and writing of data to said memory cell array;

pseudo ground level supply means for supplying a pseudo around level potential between said ground potential and said predetermined potential, to a line which provides a low level potential to each of said bit line and said memory cell;

driving means for driving said sense amplifier with said predetermined potential, said pseudo ground level potential and said ground level potential;

wherein said driving means supplies said predetermined potential and said ground level potential to said sense amplifier in a early stage of a driving operation for a predetermined period and supplies said predetermined potential and said pseudo ground level potential to said sense amplifier in a remainder of the driving operation; and whereby all of said n-channel memory cell transistors connected to unselected said word lines have the lower potential level of the gates than that of the sources.

2. The dynamic semiconductor memory device according to claim 1, wherein the active region of each n-channel memory cell transistor is isolated by a field oxide region.

3. A dynamic semiconductor memory device comprising:

an internal power supply circuit for generating an internal power supply potential based on an external power supply potential;

power supply means for supplying a predetermined potential lower than said internal power supply potential;

a plurality of word lines the potentials of which are selectively pulled down from said internal power supply potential to said predetermined potential;

a plurality of bit lines arranged to cross said plurality of word lines;

a memory cell array including a plurality of memory cells, each including a p-channel memory cell transistor having a source region, drain region and channel region formed in semiconductor layer on an insulator as an active region, each p-channel memory cell transistor further having a gate electrode above the channel region with an insulator layer therebetween, wherein the source region is connected to one of said bit lines and the gate electrode is connected to one of said word lines;

a sense amplifier for amplifying a potential change in accordance with stored data which is read out to said bit line corresponding to one memory cell of said memory cell array;

control means for controlling readout of data from said memory cell array and writing of data to said memory cell array;

pseudo power supply level means for supplying a pseudo power supply level potential between said predetermined potential and said internal power supply potential, to a line which provides a high level potential to each of said bit line and said memory cell;

driving means for driving said sense amplifier with said predetermined potential, pseudo power supply level potential and said internal power supply potential;

wherein said driving means supplies said predetermined potential and said internal power supply potential to said sense amplifier in a early stage of a driving operation for a predetermined period and supplies said predetermined potential and said pseudo power supply level potential to said sense amplifier in a remainder of a driving operation; and whereby all of said p-channel memory cell transistors connected to unselected said word lines have a higher potential level of a gates than that of a sources.

4. The dynamic semiconductor memory device according to claim 3, wherein the active region of each p-channel memory cell transistor is isolated by a field oxide region.

* * * * *